United States Patent
Leem et al.

(10) Patent No.: US 7,693,361 B2
(45) Date of Patent: Apr. 6, 2010

(54) HYBRID LASER DIODE

(75) Inventors: Young-Ahn Leem, Daejeon (KR);
Jung-Ho Song, Daejeon (KR); Ki-Soo Kim, Daejeon (KR); O-Kyun Kwon, Daejeon (KR); Gyung-Ock Kim, Seoul (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 12/117,710

(22) Filed: May 8, 2008

(65) Prior Publication Data

US 2009/0116523 A1    May 7, 2009

(30) Foreign Application Priority Data

Nov. 7, 2007    (KR) .............. 10-2007-0113130

(51) Int. Cl.
G02B 6/00    (2006.01)

(52) U.S. Cl. .............................. 385/14; 372/30

(58) Field of Classification Search ............. 385/14; 372/46.011, 50.012; 359/326
See application file for complete search history.

(56) References Cited

U.S. PATENT DOCUMENTS

| | | | |
|---|---|---|---|
| 4,776,661 A | 10/1988 | Handa | |
| 4,935,930 A | 6/1990 | Handa | |
| 5,109,464 A | 4/1992 | Munowitz et al. | |
| 6,108,478 A * | 8/2000 | Harpin et al. | 385/129 |
| 6,229,947 B1 * | 5/2001 | Vawter et al. | 385/132 |
| 6,381,380 B1 * | 4/2002 | Forrest et al. | 385/14 |
| 6,956,983 B2 * | 10/2005 | Morse | 385/14 |
| 2005/0069004 A1 * | 3/2005 | Watanabe et al. | 372/49 |

OTHER PUBLICATIONS

Alexander W. Fang et al. "*Electrically pumped hybrid AlGaInAs-silicon evanescent laser*" Optics Express, vol. 14, No. 20, pp. 9203-9210, Oct. 2, 2006.

* cited by examiner

*Primary Examiner*—Minsun Harvey
*Assistant Examiner*—Tuan N. Nguyen

(57) ABSTRACT

Provided is a hybrid laser diode. The hybrid laser diode includes: a silicon layer constituting a slab waveguide; and a compound semiconductor layer disposed on the silicon layer to constitute a channel waveguide.

17 Claims, 11 Drawing Sheets

HYBRID LASER DIODE

CROSS-REFERENCE TO RELATED APPLICATIONS

This U.S. non-provisional patent application claims priority under 35 U.S.C. §119 of Korean Patent Application No. 10-2007-113130, filed on Nov. 7, 2007, the entire contents of which are hereby incorporated by reference.

BACKGROUND OF THE INVENTION

The present invention disclosed herein relates to a semiconductor device, and more particularly, to a hybrid laser diode.

The present invention has been derived from research undertaken as a part of the information technology (IT) development business by the Ministry of Information and Communication and the Institute for Information Technology Advancement of the Republic of Korea [Project management No.: 2006-S-004-02, Project title: silicon-based high speed optical interconnection IC].

A hybrid laser diode using silicon and a III-V group compound semiconductor receives attention as a light source for photonics technology combining optical technology with electronic device technology.

FIG. 1 is a sectional view of a typical hybrid laser diode.

Referring to FIG. 1, a buried insulating layer 12, a silicon layer 13, and a light emitting diode 42 are sequentially stacked on a substrate 11. At this point, a silicon-on-insulator (SOI) substrate 41 is used for the substrate 11, the buried insulating layer 12, and the silicon layer 13.

The light emitting diode 42 is formed by patterning a III-V group compound semiconductor substrate, and includes an n-type semiconductor layer 21, an active layer 22, and a p-type semiconductor layer 25, which are sequentially stacked. In more detail, the III-V group compound semiconductor substrate can be attached to the SOI substrate 41 through wafer bonding technology, and the p-type semiconductor layer 25 and the active layer 22 of the attached III-V group compound semiconductor substrate are patterned to expose the top surface of the n-type semiconductor layer 21. Therefore, a slab waveguide SW is formed as illustrated in FIG. 1.

On the other hand, before attaching the III-V group compound semiconductor substrate, the silicon layer 13 is patterned to form a channel waveguide CW, which has the narrower width than the slab waveguide SW and is disposed below the slab waveguide SW. The channel waveguide CW has the width narrower than that of the slab waveguide SW. Accordingly, a void region 99 exposing the buried insulating layer 12 and filled with air is formed around the channel waveguide CW.

According to a hybrid laser diode, an optical mode of laser generated in the light emitting diode 42 overlaps at both the channel waveguide CW and the slab waveguide SW. Accordingly, the optical mode is guided by the channel waveguide CW, and can be electrically pumped in the light emitting diode 42 at the same time.

On the other hand, a related hybrid laser diode has technical limitations such as large leakage current, low thermal stability, and high series resistance. In more detail, since the active layer 22 and the p-type semiconductor layer 24 constituting the slab waveguide SW are formed to occupy a large area, current for an operation of the light emitting diode can be dispersed. To resolve this current dispersion, suggested is a method of forming an impurity region 24 defining an active region in the active layer 22 and/or the p-type semiconductor layer 25 using an ion implantation technique. That is, the active region is formed in the active layer 22 and/or the p-type semiconductor layer 25 disposed between the impurity regions 24.

However, as is well-known, due to atomic collisions during an ion implantation process and a subsequent diffusion of atoms, spatial distribution of impurity concentration, which is implanted through ion implantation technique, is close to Gaussian distribution. That is, the impurity region 24 has a gradient of concentration. Accordingly, a boundary of the impurity region 24 may not be discretely defined in both a vertical direction and a horizontal direction.

The active region defined by the impurity region 24 is a place where light emitting phenomenon occurs and which is used as the slab waveguide SW. Therefore, the horizontal gradient of impurity concentration is a factor that deteriorates an optical characteristic of a laser diode. Additionally, due to the vertical gradient of impurity concentration, impurities may be diffused into the n-type semiconductor layer 21, and this may increase an electrical resistance of a current path of light emitting diode.

Furthermore, as described above, the void region 99 filled with air has a low thermal conductivity, and thus heat generated from the light emitting diode 42 may not be efficiently emitted. Since operational and optical characteristics of a laser diode are very susceptible to a temperature, these poor thermal emission characteristics may deteriorate product characteristics. Additionally, since the distance between the active region and an n-type electrode 31 cannot be reduced by the impurity region 24, a typical hybrid laser diode suffers from a high series resistance between the n-type electrode 31 and a p-type electrode 32.

SUMMARY OF THE INVENTION

The present invention provides a hybrid laser diode capable of reducing a leakage current.

The present invention also provides a hybrid laser diode including a discretely defined active region and waveguide.

The present invention also provides a hybrid laser diode including an excellent thermal emission characteristic.

The present invention also provides a hybrid laser diode having a low series resistance between n-type and p-type electrodes.

The present invention also provides a hybrid laser diode capable of reducing loss of a waveguide mode.

Embodiments of the present invention provide hybrid laser diodes including: a silicon layer constituting a slab waveguide; and a compound semiconductor layer disposed on the silicon layer to constitute a channel waveguide.

In some embodiments, the width of the channel waveguide is narrower than that of the slab waveguide.

In other embodiments, the width of the channel waveguide and the thickness of the slab waveguide are configured to satisfy a single waveguide mode condition and a waveguide mode size condition.

In still other embodiments, the width of the channel waveguide ranges from about 1 μm to about 2.2 μm, and the thickness of the slab waveguide ranges from about 200 nm to 700 nm.

In even other embodiments, the hybrid laser diodes further include a coupling structure disposed on a side of the slab waveguide and mode-converting an optical waveguide mode into the silicon layer, the optical waveguide mode being generated in the compound semiconductor layer.

In yet other embodiments, the hybrid laser diodes further include: a substrate disposed below the silicon layer; a buried insulating layer interposed between the substrate and the silicon layer; and a connection waveguide extending from the slab waveguide to a predetermined optical device, above the buried insulating layer. The connection waveguide is formed of the silicon layer and has the cross-sectional width narrower than that of the slab waveguide.

In further embodiments, the connection waveguide includes: a connection region extending from the slab waveguide and having the broader width than the channel waveguide; a transmission region having the narrower width than the channel waveguide; and a transition region connecting the connection region with the transmission region and having the width, the width being gradually decreased as it approaches from the connection region toward the transmission region.

In still further embodiments, the compound semiconductor layer further includes a coupling region extending from the channel waveguide to be disposed on the connection waveguide. The cross sectional width of the coupling region is progressively narrower away from the slab waveguide.

In even further embodiments, the compound semiconductor layer includes at least one of an InP thin layer and an InGaAsP thin layer, and further includes a silicon oxide layer interposed between the compound semiconductor layer and the silicon layer.

In yet further embodiments, the entire bottom surface of the compound semiconductor layer contacts the silicon layer or the silicon oxide layer.

In yet further embodiments, the hybrid laser diodes further include a resonance structure disposed at two facing sides of the slab waveguide.

According to the present invention, provided is a hybrid laser diode using a silicon layer and a III-V group semiconductor layer as a slab waveguide and a channel waveguide, respectively. Since the channel waveguide is formed through patterning, a current path for an operation of a light emitting diode is discretely defined. Accordingly, typical limitations such as leakage current, series resistance, and power consumption can be resolved. Moreover, because the slab waveguide directly contacts the entire bottom surface of a light emitting diode, a typical thermal limitation can be also reduced.

Furthermore, according to the present invention, because a silicon layer where most of a waveguide mode is distributed is used as a slab waveguide, the loss of a waveguide mode due to its change can be reduced. Moreover, a coupling structure connecting the slab waveguide with a predetermined optical device contributes to reducing the loss of the waveguide mode. As a result, a hybrid laser diode according to the present invention can have a high coupling efficiency.

BRIEF DESCRIPTION OF THE FIGURES

The accompanying figures are included to provide a further understanding of the present invention, and are incorporated in and constitute a part of this specification. The drawings illustrate exemplary embodiments of the present invention and, together with the description, serve to explain principles of the present invention. In the figures.

DETAILED DESCRIPTION OF PREFERRED EMBODIMENTS

Figure 1:
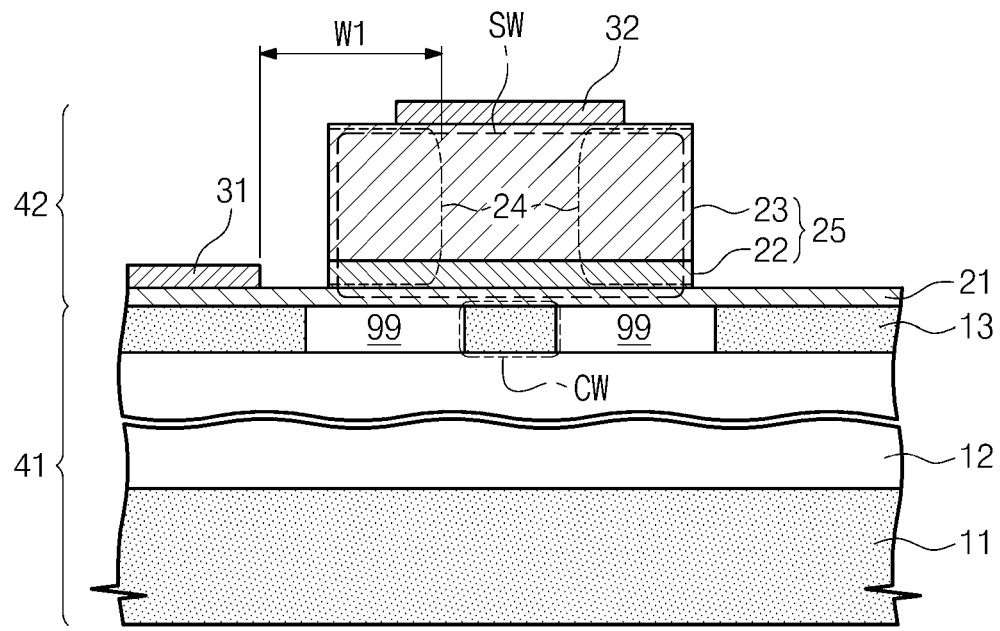
FIG. 1 is a sectional view of a typical hybrid laser diode.

Preferred embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout.

Figure 2:
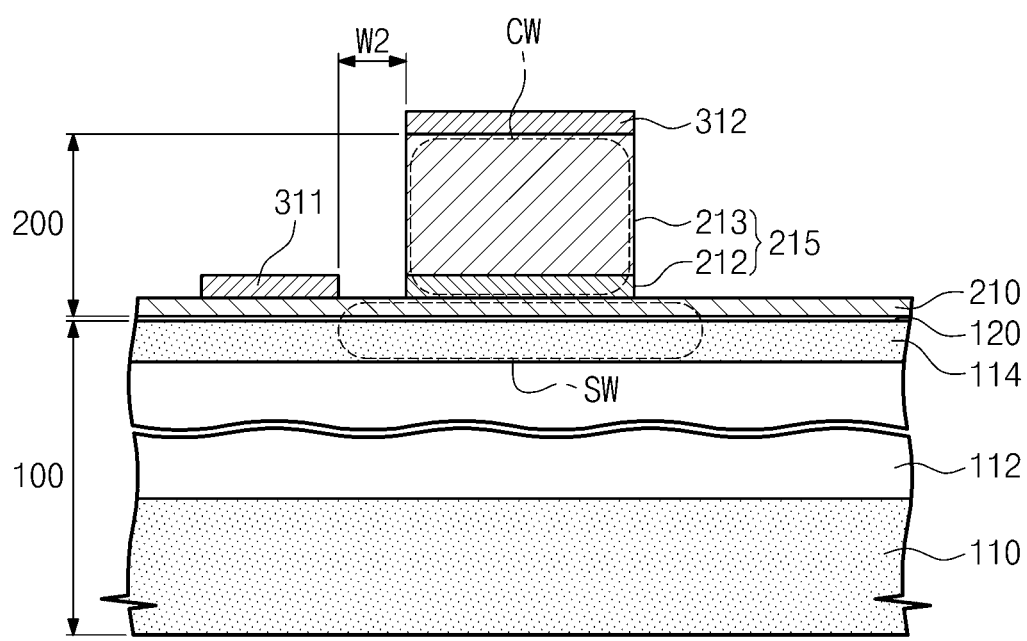
FIG. 2 is a sectional view of a hybrid laser diode according to the present invention.

FIG. 2 is a sectional view of a hybrid laser diode according to the present invention.

Referring to FIG. 2, a buried insulating layer 112, a silicon layer 114, and a light emitting diode 200 are sequentially stacked on a substrate 110. A silicon-on-insulator (SOI) substrate 100 is used for the substrate 110, the buried insulating layer 112, and the silicon layer 114.

According to the present invention, the silicon layer 114 is used as a slab waveguide SW. For this end, the silicon layer 114 is formed below the light emitting diode 200 to have the broader width than the light emitting diode 200. That is, according to the present invention, the silicon layer 1114 may be formed to contact the entire bottom surface of the light emitting diode 200 as illustrated in FIG. 2. According to a typical method, because the silicon layer 114 is used as a channel waveguide CW, the void region 99 of FIG. 1 preventing a heat generated in the emitting diode from being emitted is formed around the silicon channel waveguide CW of FIG. 1. However, in a case where the silicon layer 114 of the present invention contacts the entire bottom surface of the light emitting diode 200, the above limitation for thermal emission can be reduced.

The light emitting diode 200 is formed by patterning a III-V group compound semiconductor substrate, and includes a sequentially stacked n-type semiconductor layer 210, active layer 212, and p-type semiconductor layer 213. More specifically, the III-V group compound semiconductor substrate is attached on the silicon layer 114 using wafer bonding technique. The wafer bonding technique may be performed using a method (e.g., oxygen plasma bonding technique) capable of reducing a thermal stress, which may be caused by a thermal expansion coefficient difference between the III-V group compound semiconductor substrate and the silicon layer 114.

In this case, an oxide layer 120 is formed between III-V group compound semiconductor substrate and the silicon layer 114 to attach them. The thickness of the oxide layer 120 can be adjusted by controlling a time for an oxygen plasma process, and ranges from about 0.01 μm to about 0.03 μm. The oxide layer 120 prevents an operating current of the light emitting diode from flowing into the silicon layer 114. This contributes to reducing an operating current leakage and power consumption of a product according thereto.

The n-type semiconductor layer 210 may include at least one of an n-type InP layer and an n-type InGaAsP layer. Additionally, the active layer 212 may include at least one of an InGaAsP layer and an AlGaInAs layer. The p-type semiconductor layer 213 may further include at least one of a p-type InP layer, a p-type InGaAsP layer, a p-type InGaAs layer, and a p-type AlGaInAs layer. On the other hand, materials for the n-type semiconductor layer 210, the active layer 212, and the p-type semiconductor layer 213 are exemplified for describing embodiments that realize the present invention, but the technical features of the present invention are not limited to the above materials. That is, well-known various materials can be used to realize the light emitting diode 200.

The p-type semiconductor layer 213 and the active layer 212 are patterned to expose the top surface of the n-type semiconductor layer 210, as illustrated in FIG. 2, thereby forming the channel waveguide CW having the narrower width than the slab waveguide SW. A p-electrode 312 and an n-electrode 311, which supply a current involved in light emitting phenomenon, are disposed on top surfaces of the p-type semiconductor layer 213 and the exposed n-type semiconductor layer 210, respectively.

On the other hand, since the p-type semiconductor layer 213 and the active layer 212 used as the channel waveguide CW and the light emitting diode 200 are formed through a patterning process, an active region where light emitting phenomenon occurs and the channel waveguide where an optical mode of a generated light is distributed may be discretely and substantially defined by sidewalls of the patterned p-type semiconductor layer 213 and the active layer 212. That is, according to the present invention, the active region and the waveguide (specifically, the channel waveguide CW) can be defined without using the ion implantation process, thereby preventing the problem of leakage current in the conventional art.

Furthermore, as described above, since the channel waveguide CW is defined without using an ion implantation process to form the impurity region 24 of FIG. 1, the spatial distance W2 between the active region and the n-electrode 311 can be shortened than that of FIG. 1 (i.e., W1), and therefore, a series resistance between the n-electrode 311 and the p-electrode 312 can be reduced. Additionally, as described above, since an ion implantation process is not used to define the active region and the channel waveguide CW, a diffusion of impurity into the n-type semiconductor layer 210 and an increase of electrical resistance can be reduced. As a result, a power consumption of the hybrid laser diode can be reduced significantly.

Since the light emitting diode 200 defines the channel waveguide CW, the light emitting diode 200 can provide functions for generating light, guiding an optical mode of the generated light, and amplifying intensity of the generated light. Additionally, as described above, since the optical mode of laser overlaps both the channel waveguide CW and the slab waveguide SW, the light generated in the light emitting diode can be resonated through the silicon layer 114 or an additional resonator disposed around the silicon layer 114 (e.g., see 600 of FIG. 12).

Figure 3:
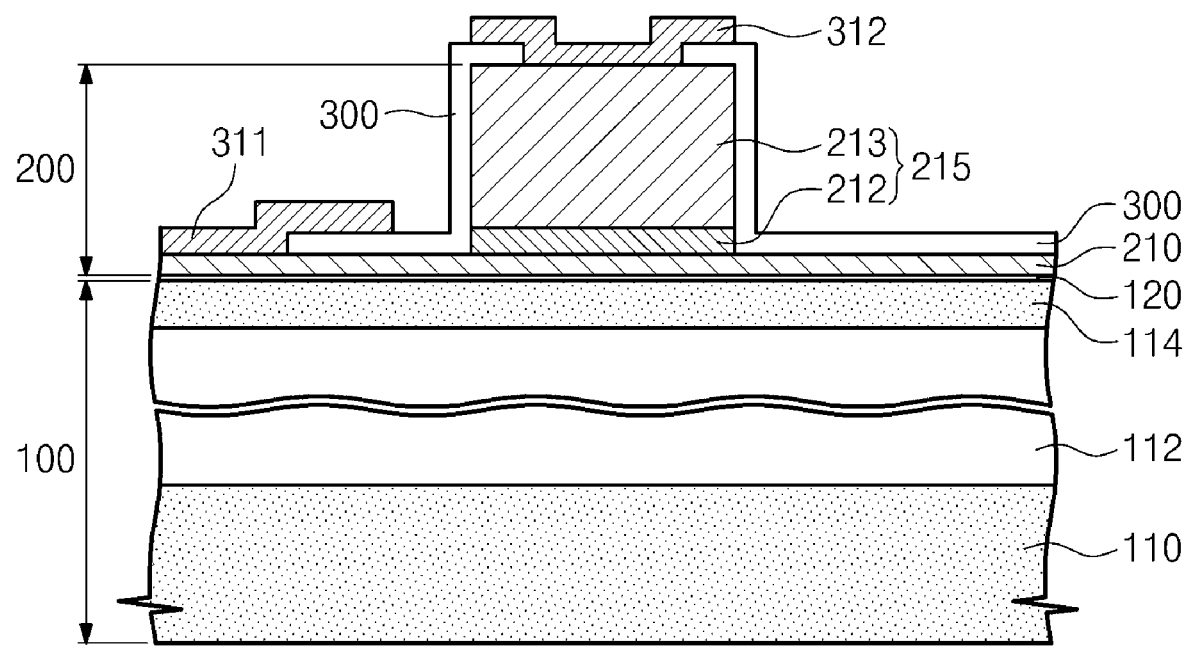
FIG. 3 is a sectional view of a hybrid laser diode according to one embodiment of the present invention.

FIG. 3 is a sectional view of a hybrid laser diode according to one embodiment of the present invention. The embodiment of FIG. 3 is similar to that of FIG. 2, and thus its overlapping description will be omitted for conciseness.

Referring to FIG. 3, an insulating layer 300 is formed on the resultant structure with the light emitting diode 200. The insulating layer 300 is formed to have openings that expose the top surface of the p-type semiconductor layer 213 and the top surface of the n-type semiconductor 210. The p-type and n-type electrodes 312 and 311 are electrically connected to the top surface of the p-type semiconductor layer 214 and the top surface of the n-type semiconductor layer 210, respectively, through the openings. The insulating layer 300 may be polyimide, but the present invention is not limited thereto.

Furthermore, a sidewall passivation pattern (not shown) is further disposed at the sidewall of the light emitting diode 200. The sidewall passivation pattern may be disposed between the sidewall of the light emitting diode 200 and the insulating layer 300. According to the present invention, the insulating layer 300 and/or the sidewall passivation pattern may be formed of a material having a different refractive index than the light emitting diode 200, or it may be formed of at least one of materials capable of confining an optical mode in the channel waveguide CW.

Figure 4:
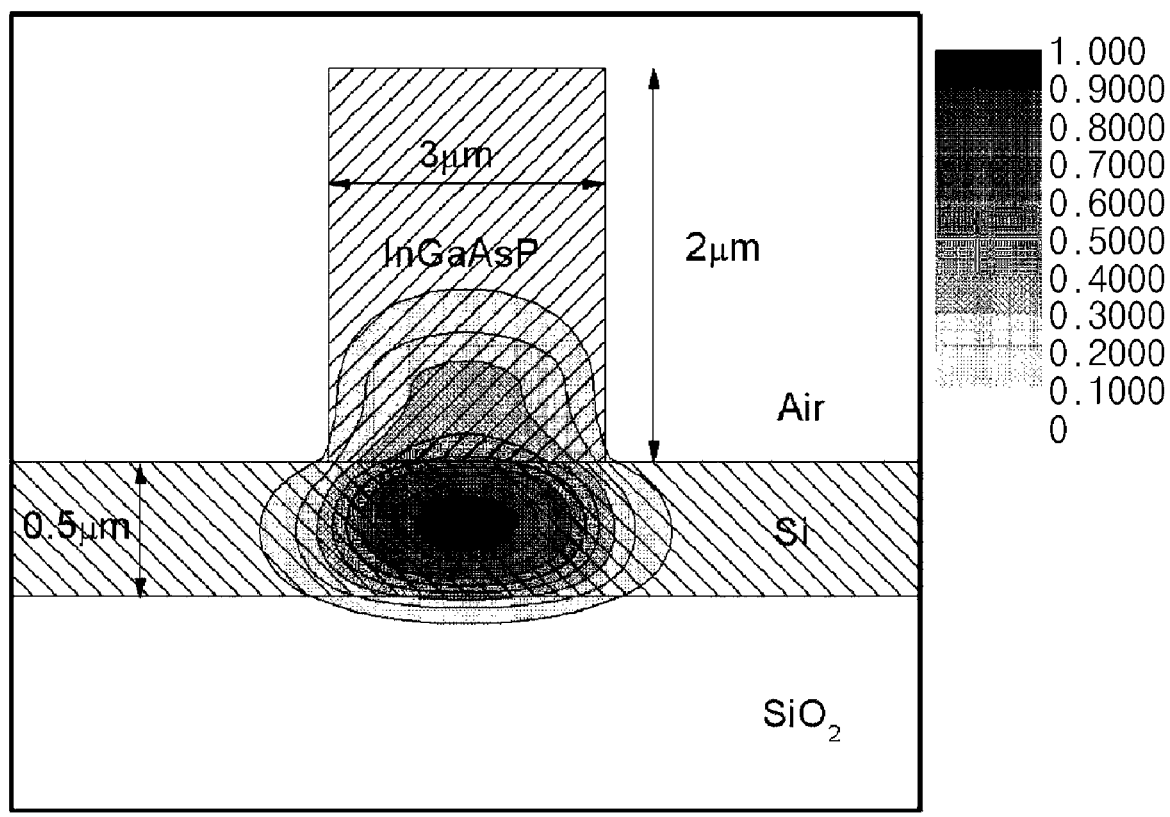
FIG. 4 is a view of the simulation result illustrating an optical mode generated in a hybrid laser diode according to the present invention.

FIG. 4 is a view of the simulation result illustrating an optical mode generated in a hybrid laser diode according to the present invention. This simulation is executed under the conditions such as a thin layer material, the thickness of a thin layer, and the width of the channel waveguide CW of Table 1 below, and a simulator is BeamPROP FullWAVE Band-SOLVE from an RSoft company.

TABLE 1

|  | p-type semiconductor layer 213 | Active layer 212 | n-type semiconductor layer 210 | Oxide layer 120 | Silicon layer 113 | Buried insulating layer 112 |
| --- | --- | --- | --- | --- | --- | --- |
| Material | p-type InP | InGaAsP | n-type InP | SiO2 | Si | SiO2 |
| Thickness (μm) | 1.529 | 0.3 | 0.2 | 0.02 | 0.5 | 3 |
| Width(μm) | 3 | 3 | — | — | — | — |

Referring to FIG. 4, when using the silicon layer 114 as the slab waveguide SW, it is confirmed that a transverse waveguide mode of laser is generated.

Figure 5:
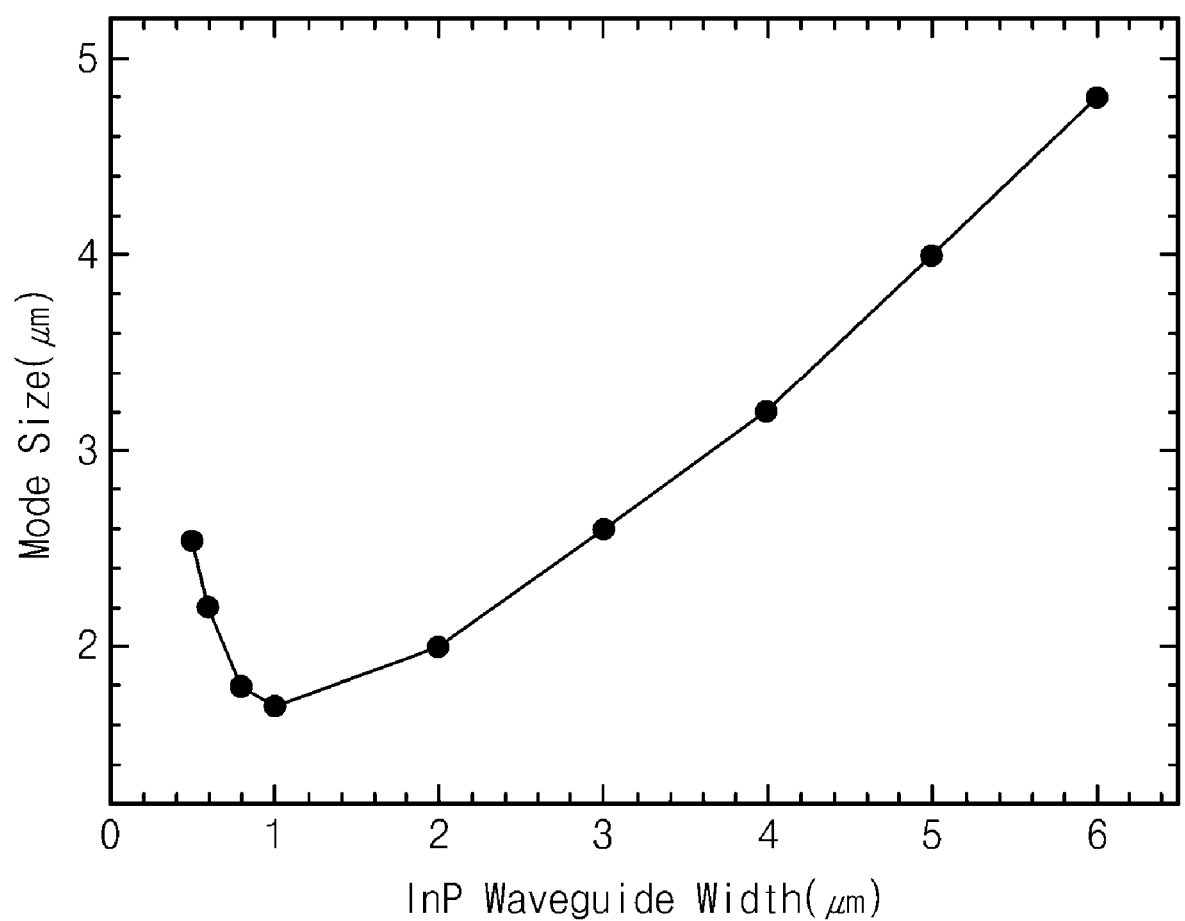
FIG. 5 is a graph illustrating the result of simulating the size of an optical mode according to the width of a channel waveguide.

FIG. 5 is a graph illustrating the result of simulating the size of an optical mode according to the width of a channel waveguide. In FIG. 5, the horizontal-axis represents the width of a channel waveguide CW and the vertical-axis represents the size of a calculated waveguide mode.

Referring to FIG. 5, the size of the waveguide mode has the minimum value when the width of the channel waveguide CW is about 1 μm. That is, the size of the waveguide mode decreases as the width of the channel waveguide CW is reduced. However, the size is inversely proportional when the width of the channel waveguide CW is below about 1 μm. Accordingly, under the conditions of Table 1, the channel waveguide CW should have a width of 1 μm or more, to confine a waveguide mode along a horizontal direction.

On the other hand, according to another simulation, when the width of the channel waveguide CW is below about 1.8 μm, single mode condition is satisfied. Accordingly, to satisfy the conditions of the single mode and horizontal confinement, the width of the channel waveguide CW ranges from about 1 μm to about 1.8 μm. Here, this result exemplarily describes a method of selecting a design value obtainable from the conditions of Table 1, but may be obviously changed according to a thin layer material and the thickness of a thin layer.

Figure 6:
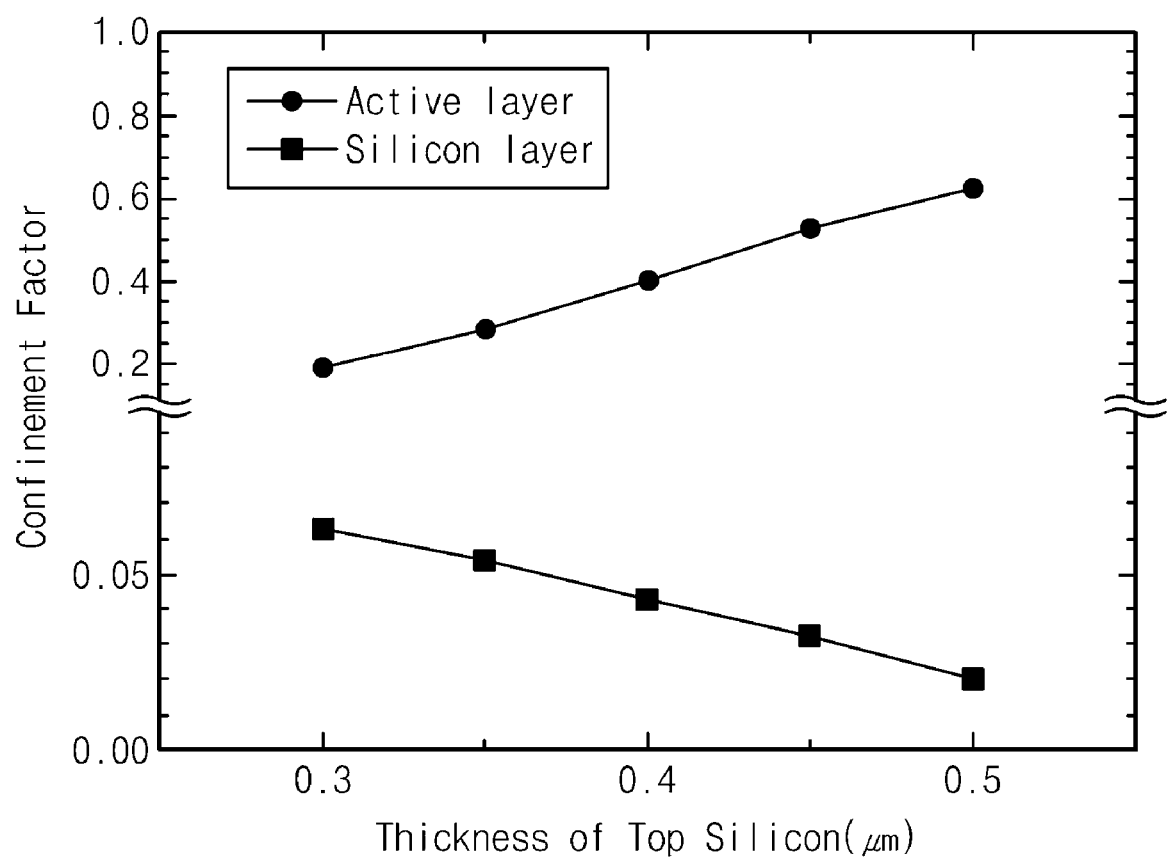
FIG. 6 is a graph illustrating the result of simulating a confinement factor of a waveguide mode according to the thickness of a silicon layer.
Figure 7:
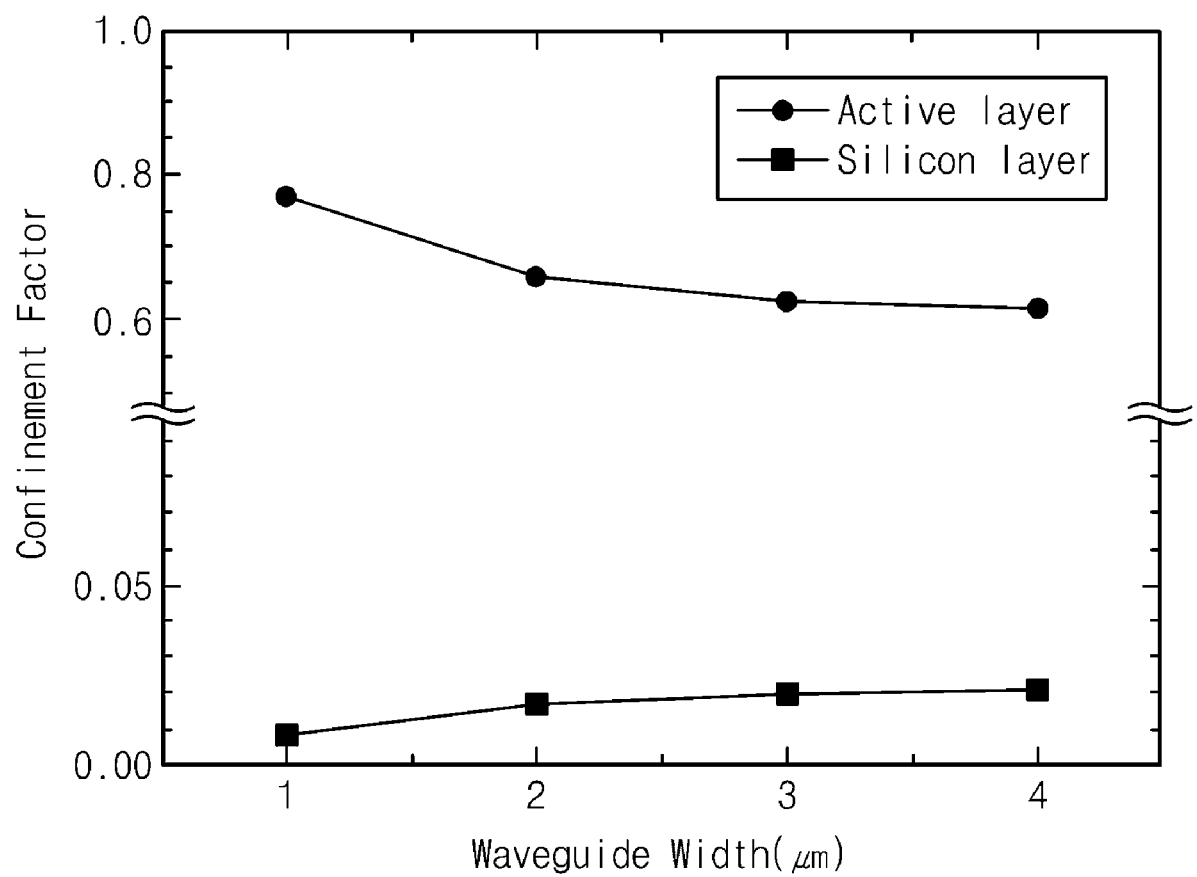
FIG. 7 is a graph illustrating the result of simulating a confinement factor of a waveguide mode according to the width of a channel waveguide.

FIG. 6 is a graph illustrating the result of simulating a confinement factor of a waveguide mode according to the thickness of a silicon layer. FIG. 7 is a graph illustrating the result of simulating a confinement factor of a waveguide mode according to the width of a channel waveguide.

Referring to FIGS. 6 and 7, as the thickness of the silicon layer 114 increases, a confinement factor in the silicon layer 114 is linearly increased, but a confinement factor of the active layer 212 is linearly decreased. On the contrary, as the width of the channel waveguide CW increases, a confinement factor at the silicon layer 114 decreases, but a confinement factor at the active layer 212 increases. As well understood from the comparison of FIGS. 6 and 7, the vertical distribution of a waveguide mode is more sensitive to the thickness of the silicon layer 114 compared to the width of the channel waveguide CW. Accordingly, it is efficient that the vertical distribution of a waveguide mode is adjusted by controlling the thickness of the silicon layer 114.

On the other hand, according to the present invention, as illustrated in FIGS. 6 and 7, since most of generated waveguide mode is distributed on the silicon slab waveguide SW, a substantial loss of waveguide mode does not occur even if impurity concentration of the p-type semiconductor layer 213 for cladding is increased. Accordingly, according to the present invention, the p-type semiconductor layer 213 may be formed to have an increased impurity concentration, and in this case, a contact resistance characteristic between the p-type semiconductor layer 213 and the p-electrode can be improved.

Figure 8:
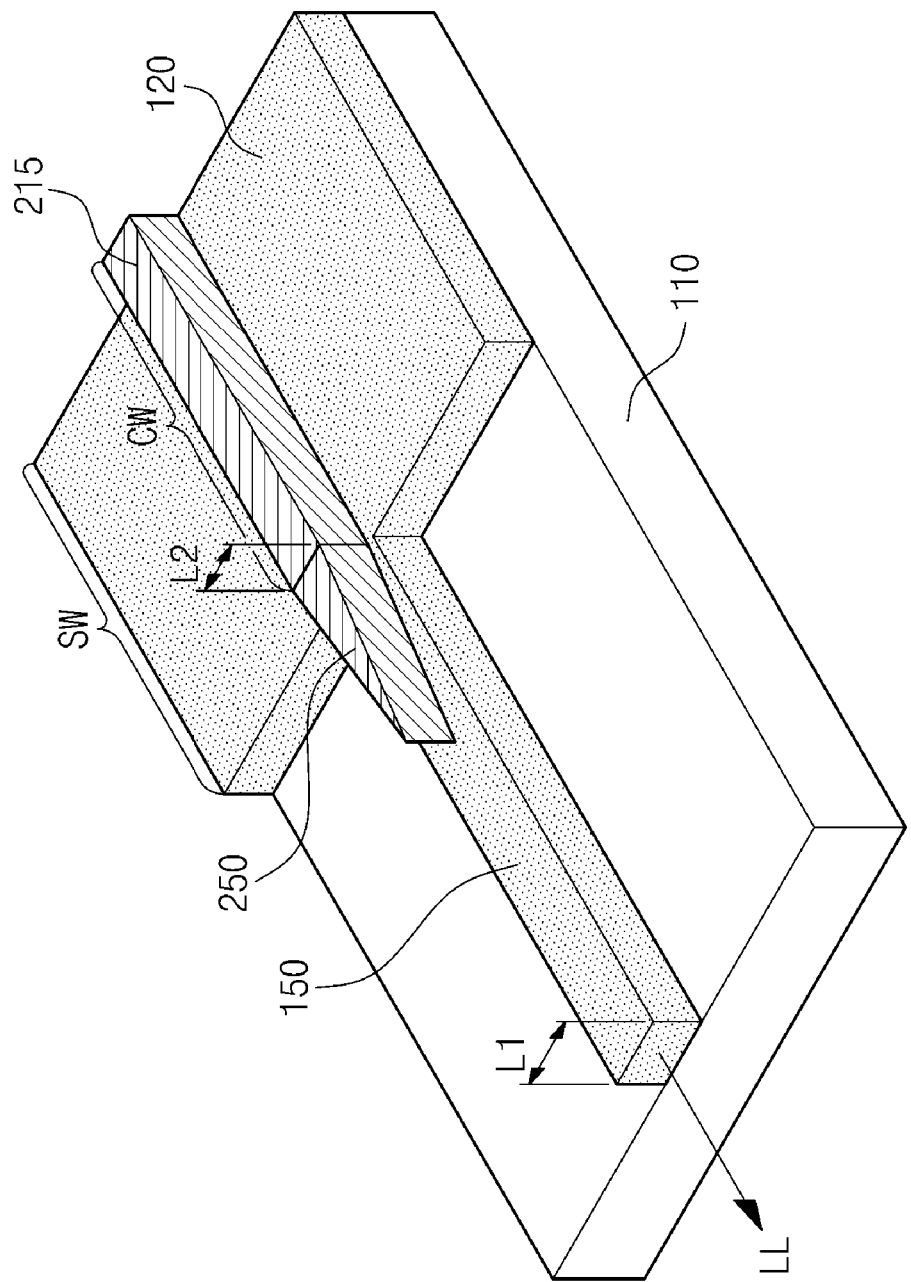
FIG. 8 is a perspective view of a hybrid laser diode according to one embodiment of the present invention.

FIG. 8 is a perspective view of a hybrid laser diode according to one embodiment of the present invention. The hybrid laser diode of this embodiment is similar to that of FIG. 2, and thus its overlapping description will be omitted for conciseness.

Referring to FIG. 8, a hybrid laser diode of the present invention further includes a connection waveguide 150 to transmit the generated laser light LL to a predetermined optical device (not shown). The optical device may be integrated on the buried insulating layer 112 and the silicon layer 114, and the silicon layer 114 can be used as a medium for an optical connection. In this case, the connection waveguide 150 extends from the slab waveguide SW of the silicon layer 114 toward the optical device.

On the other hand, as shown in FIGS. 4, 6, and 7, the waveguide mode is mainly distributed in the silicon layer 114. For all that, when a confinement factor in the silicon layer 114 is small, an output power of the laser light LL transmitted through the connection waveguide 150 can be drastically reduced. In that point, for the hybrid laser diode, a coupling coefficient is needed to be high. Here, the coupling coefficient may be defined as an efficiency transmitting a waveguide mode from the channel waveguide CW to the connection waveguide 150.

Figure 9:
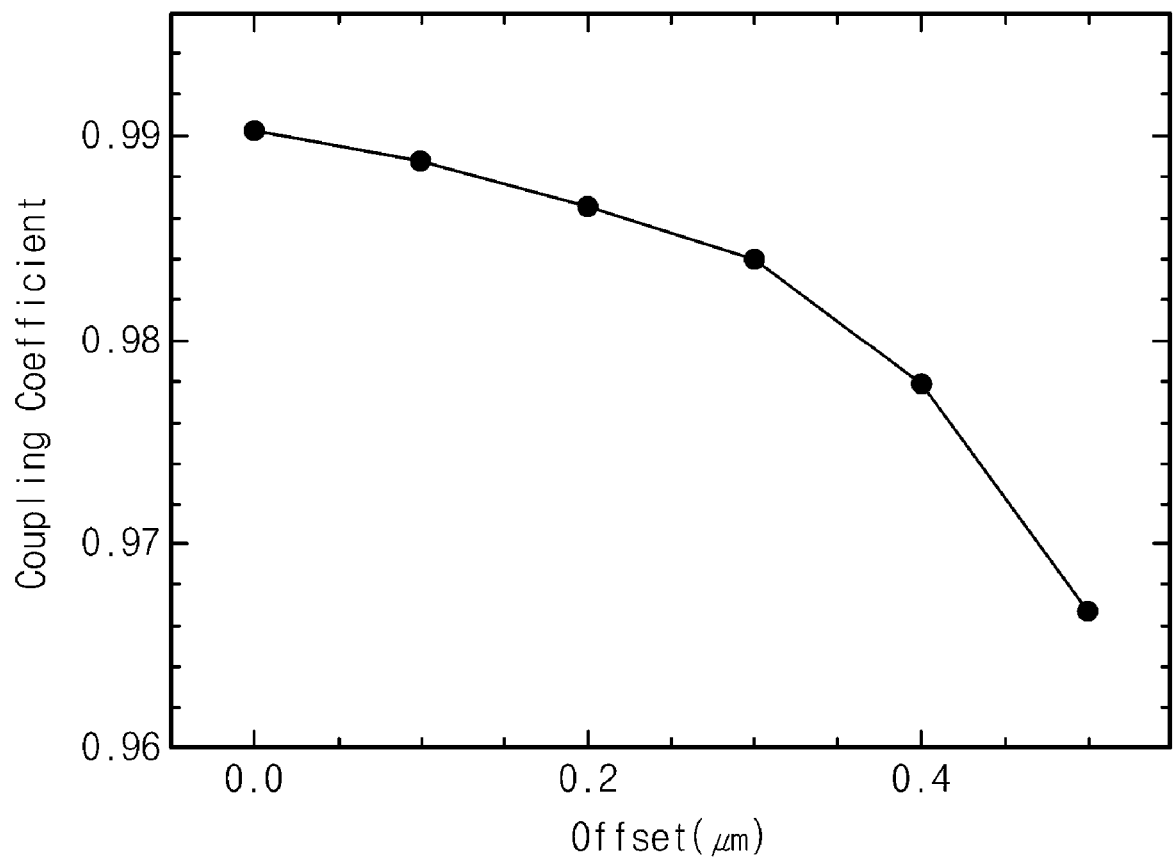
FIG. 9 is a graph illustrating the result of simulating coupling efficiency of a hybrid laser diode of FIG. 8.
Figure 10:
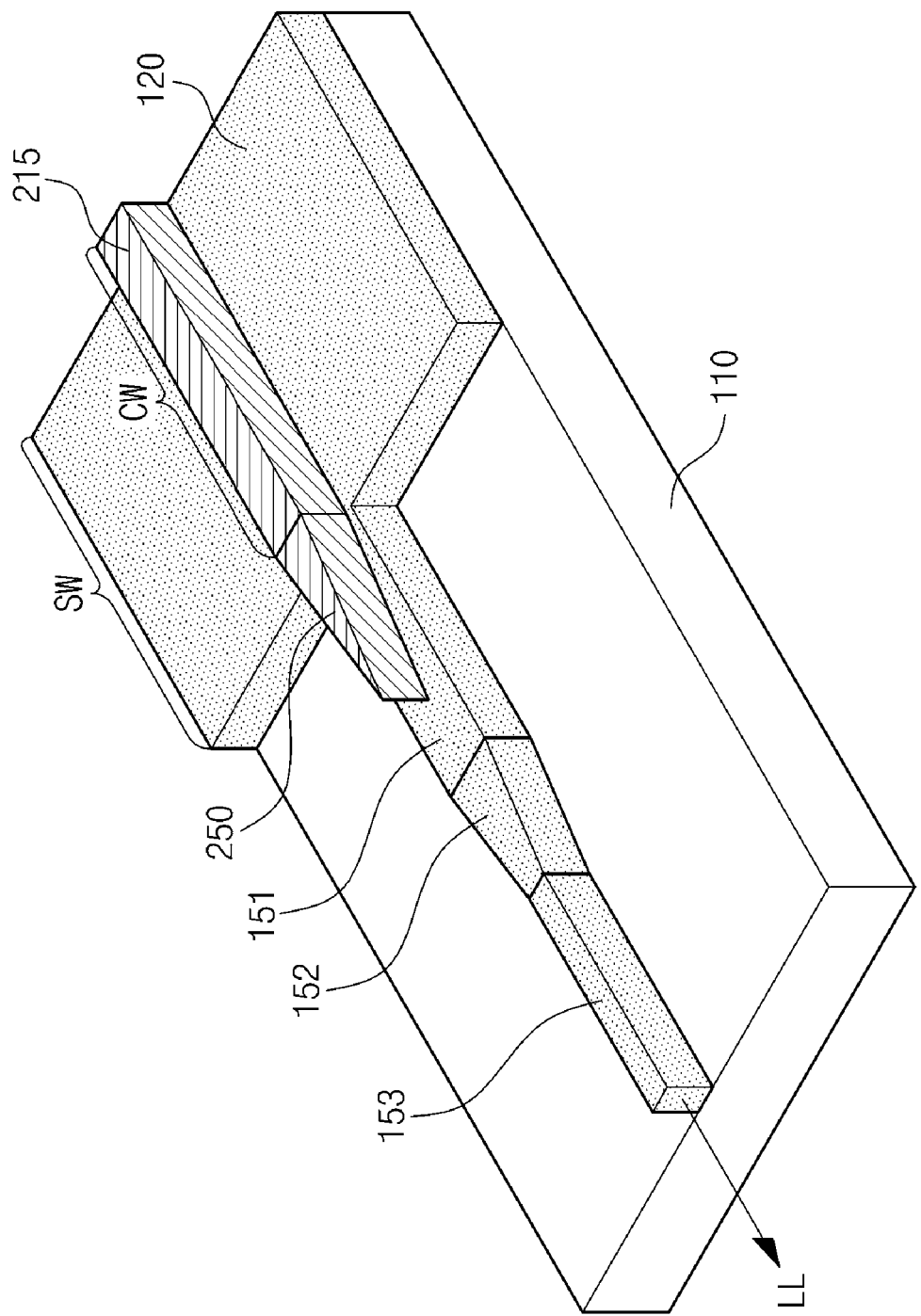
FIG. 10 is a perspective view of a hybrid laser diode according to another embodiment of the present invention.

For this end, the coupling region 250 extending from the channel waveguide CW may be disposed on the connection waveguide 150. The coupling region 250 is formed to have the width that is progressively reduced away from the channel waveguide CW as illustrated in FIGS. 8 through 10. That is, the coupling region 250 may have a taper shape. The coupling region 250 contributes to increasing the coupling coefficient.

The coupling coefficient is mainly determined by the size of an offset, which represents the degree of misalignment between the connection waveguide 150 and the channel waveguide CW. According to the present invention, due to the coupling region 250 with a tapered shape, as illustrated in FIG. 9, sufficiently large coupling coefficient can be realized at even a misalignment margin of about 0.4 μm, which can be reduced using a typical manufacturing process. At this point, FIG. 9 is a graph illustrating the result of simulating coupling efficiency of a hybrid laser diode of FIG. 8.

On the other hand, the coupling coefficient is dependent on geometric characteristics of components such as the thickness and width of the connection waveguide 150. Accordingly, a method of adjusting dimensional properties of the connection waveguide 150, the channel waveguide CW, and the slab waveguide SW may be used for controlling the coupling coefficient and the waveguide mode. Especially, to obtain a sufficiently large coupling coefficient, the width L1 of the connection waveguide 150 may be broader than the width L2 of the channel waveguide CW.

FIG. 10 is a perspective view of a hybrid laser diode according to another embodiment of the present invention. Except for modification in the structure of the connection waveguide 150, the hybrid laser diode of this embodiment is similar to that of FIG. 8. Therefore, its overlapping description will be omitted for conciseness.

Referring to FIG. 10. The connection waveguide 150 includes a connection region 151 extending from the slab waveguide SW, a transition region 152 extending from the connection region 151, and a transmission region 153 extending from the transition region 152. To satisfy the above condition L1>L2, the connection region 151 may be formed to have the broader width than the channel waveguide CW and the coupling region 250. The transmission region 153 may be formed to have the width narrower than or identical to that of the channel waveguide CW. Additionally, the transition region 152 may be formed to have the width that is gradually narrowed as it approaches from the connection region 151 toward the transmission region 153.

Figure 11:
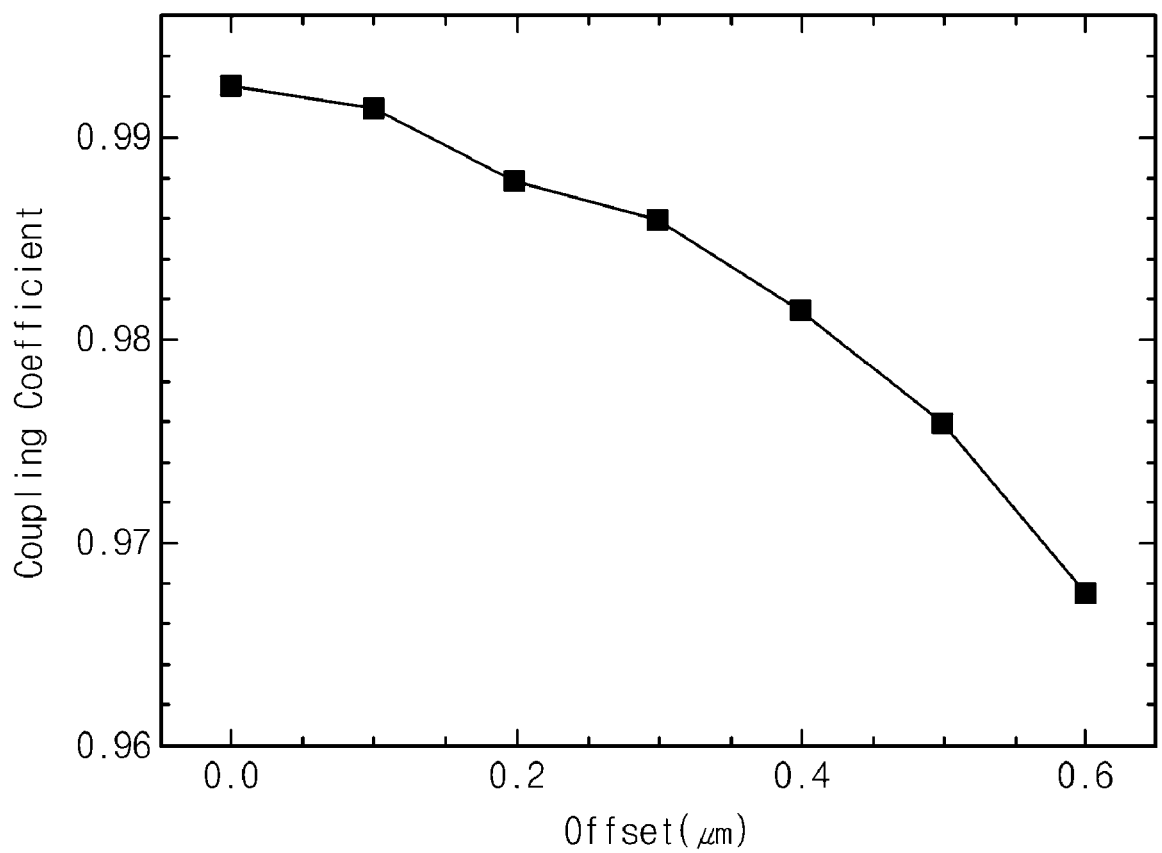
FIG. 11 is a graph illustrating the result of simulating coupling efficiency of a hybrid laser diode of FIG. 10.

FIG. 11 is a graph illustrating the result of simulating coupling efficiency of a hybrid laser diode of FIG. 10.

Referring to FIGS. 9 and 11, due to the transition region 152 having the gradually decreased width, even if the transmission region 153 is included, the hybrid laser diode of FIG. 11 has a more improved coupling coefficient and offset margin, compared to the hybrid laser diode of FIG. 9.

Figure 12:
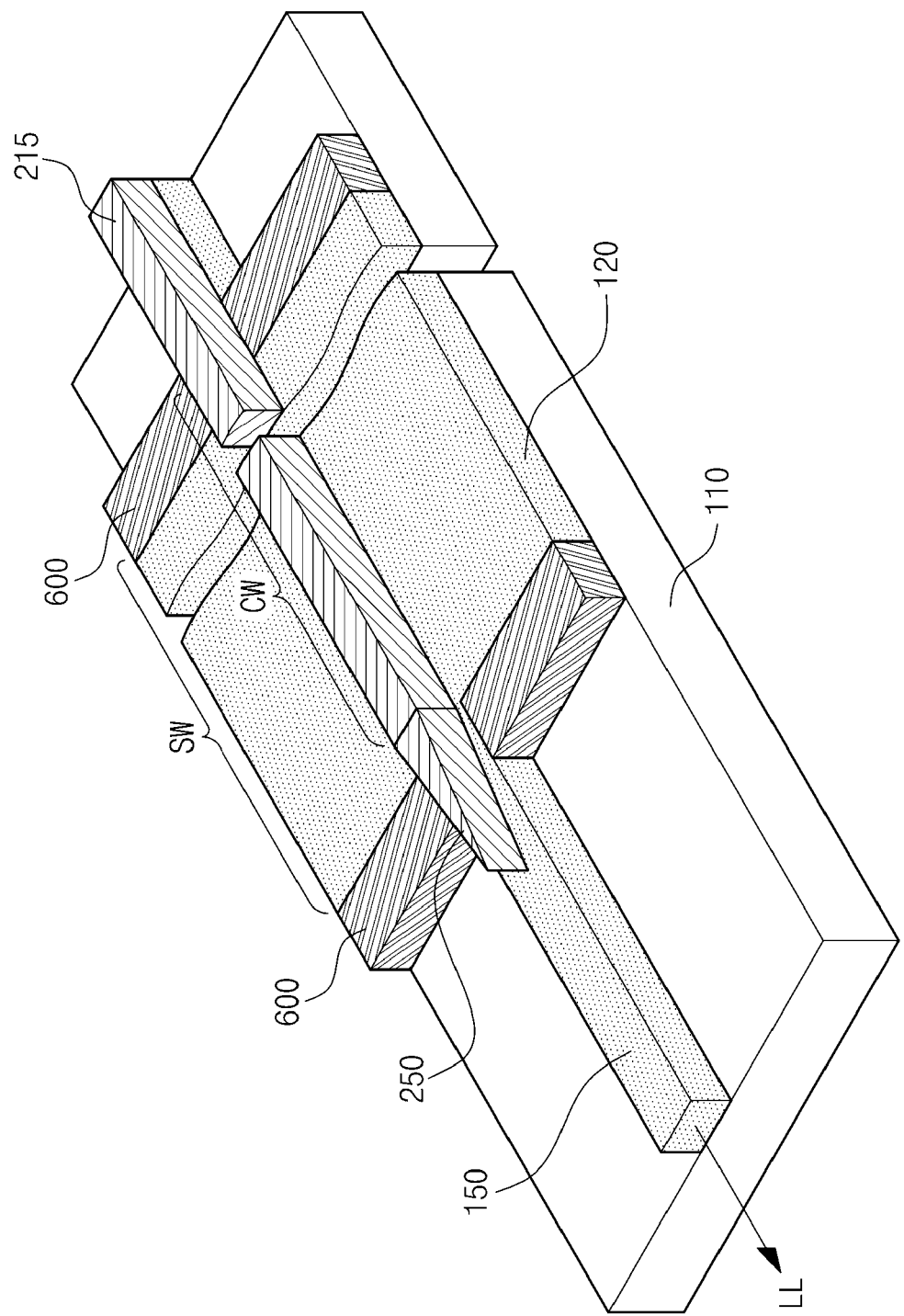
FIG. 12 is a perspective view of a hybrid laser diode according to further another embodiment of the present invention.

FIG. 12 is a perspective view of a hybrid laser diode according to further another embodiment of the present invention. Except for a part for laser resonance, the hybrid laser diode of this embodiment is similar to those of the embodiments of FIGS. 8 and 10. Thus, its overlapping description will be omitted for conciseness.

Referring to FIG. 12, the hybrid laser diode of this embodiment further may include resonance structures 600 disposed at two facing sidewalls facing the slab waveguide SW. The resonance structure 600 is disposed to induce a resonance phenomenon for the laser oscillation and may include a grating.

However, as illustrated in FIGS. 8 and 10, without an additional resonance structure, two facing sidewalls of the slab waveguide SW, which is formed of the silicon layer 110, may be used for such optical resonance.

The above-disclosed subject matter is to be considered illustrative, and not restrictive, and the appended claims are intended to cover all such modifications, enhancements, and other embodiments, which fall within the true spirit and scope of the present invention. Thus, to the maximum extent allowed by law, the scope of the present invention is to be determined by the broadest permissible interpretation of the following claims and their equivalents, and shall not be restricted or limited by the foregoing detailed description.

What is claimed is:

1. A hybrid laser diode comprising:
a silicon layer defining a slab waveguide;
a dielectric layer provided over the silicon layer;
a first semiconductor layer of a first type provided over the dielectric layer, the first semiconductor layer being coupled to a first electrode, the first semiconductor layer being electrically isolated from the silicon layer by the dielectric layer;
an active layer provided over the first semiconductor layer;
a second semiconductor layer of a second type provided over the first semiconductor layer, the second semiconductor layer being coupled to a second electrode;
a substrate disposed below the silicon layer;
a buried insulating layer interposed between the substrate and the silicon layer; and
a connection waveguide joined to and extending from the slab waveguide that is provided below the channel waveguide, the connection waveguide configured to optically couple an optical device provided in or on the buried insulating layer,
wherein the first semiconductor layer, the active layer, the second semiconductor layer define a laser diode,
wherein the active layer and the second semiconductor layer define a channel waveguide, the channel waveguide being provided over the slab waveguide, and
wherein the connection waveguide is formed of the silicon layer and has the cross-sectional width narrower than that of the slab waveguide.

2. The hybrid laser diode of claim 1, wherein the width of the channel waveguide is narrower than that of the slab waveguide.

3. The hybrid laser diode of claim 1, wherein the width of the channel waveguide and the thickness of the slab waveguide are configured to satisfy a single waveguide mode condition and a waveguide mode size condition.

4. The hybrid laser diode of claim 3, wherein the width of the channel waveguide ranges from about 1 μm to about 2.2 μm, and the thickness of the slab waveguide ranges from about 200 nm to 700 nm.

5. The hybrid laser diode of claim 1, further comprising a coupling structure disposed on a side of the slab waveguide to convert the optical waveguide mode, which is generated in the laser diode, into an optical waveguide mode in the silicon layer.

6. The hybrid laser diode of claim 1, wherein the connection waveguide comprises:
a connection region extending from the slab waveguide and having a width that is broader than that of the channel waveguide;
a transmission region having a width that is narrower than that of the channel waveguide; and
a transition region connecting the connection region with the transmission region, wherein a width of the transition region decreases as it approaches from the connection region toward the transmission region.

7. The hybrid laser diode of claim 1, wherein the diode further comprises a coupling region extending from the channel waveguide to be disposed on the connection waveguide,
wherein a cross sectional width of the coupling region becomes progressively narrower away from the slab waveguide.

8. The hybrid laser diode of claim 1, wherein the diode comprises an InP thin layer, an InGaAsP thin layer, or both.

9. The hybrid laser diode of claim 1, wherein the entire bottom surface of the diode contacts dielectric layer.

10. The hybrid laser diode of claim 1, further comprising a resonance structure disposed on first and second facing sides of the slab waveguide.

11. A hybrid laser diode comprising:
a substrate;
a light emitting diode generating a light on the substrate;
a pair of electrodes supplying a current to the light emitting diode; and
a silicon layer between the substrate and the light emitting diode;
a buried insulating layer interposed between the substrate and the silicon layer; and
a connection waveguide extending from the slab waveguide to a predetermined optical device, on the buried insulating layer,
wherein the connection waveguide is formed of the silicon layer and has the cross-sectional width narrower than that of the active pattern,
wherein the light emitting diode comprises a first compound semiconductor layer, an active pattern and a second compound semiconductor pattern, which are sequentially stacked on the silicon layer, and
wherein the active pattern and the second compound semiconductor pattern are narrower in width than the silicon layer and the first compound semiconductor layer.

12. The hybrid laser diode of claim 1, wherein the active pattern and the second compound semiconductor pattern serves as a channel waveguide, and the silicon layer and the first compound semiconductor layer serves as a slab waveguide.

13. The hybrid laser diode of claim 11, wherein the first compound semiconductor layer and the second compound semiconductor pattern are different from each other in conductivity type.

14. The hybrid laser diode of claim 11, further comprising a dielectric layer disposed between the first compound semiconductor layer and the silicon layer.

15. The hybrid laser diode of claim 14, wherein the bottom surface of the light emitting diode is directly and entirely in contact with at least one of the silicon layer and the dielectric layer.

16. The hybrid laser diode of claim 11, further comprising a coupling structure disposed on at least one of sides of the silicon layer to convert the optical waveguide mode, which is generated in the compound semiconductor layer, into an optical waveguide mode in the silicon layer.

17. The hybrid laser diode of claim 11, further comprising a resonance structure disposed on two facing sides of the silicon layer.

* * * * *